(12) United States Patent
Lim et al.

(10) Patent No.: US 6,509,780 B1
(45) Date of Patent: Jan. 21, 2003

(54) CIRCUIT COMPENSATION TECHNIQUE

(75) Inventors: Chee How Lim, Hillsboro, OR (US); Usman Azeez Mughal, Hillsboro, OR (US)

(73) Assignee: Intel Corp., Santa Clara, CA (US)

( * ) Notice: Subject to any disclaimer, the term of this patent is extended or adjusted under 35 U.S.C. 154(b) by 0 days.

(21) Appl. No.: 09/949,089

(22) Filed: Sep. 10, 2001

(51) Int. Cl.[7] ............................................. H03K 17/14
(52) U.S. Cl. ...................................... 327/378; 327/513
(58) Field of Search ................................. 327/362, 378, 327/379, 382, 513, 538; 326/30

(56) References Cited

U.S. PATENT DOCUMENTS 6,064,224 A * 5/2000 Esch, Jr. et al. .............. 326/30
6,157,206 A * 12/2000 Taylor et al. .................. 326/30

* cited by examiner

Primary Examiner—Kenneth B. Wells
(74) Attorney, Agent, or Firm—Antonelli, Terry, Stout, & Kraus, LLP.

(57) ABSTRACT

A technique for compensating a characteristic, such as a resistance, of at least one circuit includes selectively incrementing a characteristic of a dummy circuit and comparing it with a characteristic of an external reference to generate a reference code. A previous reference code is stored and subsequently compared with a present reference code. It is ensured that the present reference code differs by no more than a predetermined amount from the stored previous reference code by ceasing the incrementing or decrementing of the characteristic of the dummy circuit and utilizing the present reference code to compensate the characteristic of the at least one circuit.

17 Claims, 4 Drawing Sheets

CIRCUIT COMPENSATION TECHNIQUE

FIELD

The present invention is directed to a circuit compensation technique and more particularly, the present invention is directed to a stable predictable circuit compensation technique which is relatively insensitive to noise.

BACKGROUND

Due to their increased complexity and higher speed, high frequency processors and chipsets have become more sensitive to process, supply voltage, and temperature (PVT) variations. Accordingly, it has become necessary to compensate critical circuits for these variations. Thus, on-die terminations, I/O pre-drivers, and timing control circuits, etc., must be compensated since they affect signal reflections, transmission and reception timings, and edge rates. These circuits are often compensated by comparing the resistance of an external resistor to the resistance of an internal circuit. That is, for each kind of circuit, a separate external resistor may be used to compensate for each of the required attributes, such as, impedance, slew-rate, timing, etc.

Once the internal resistance has been matched to the external resistor, a certain digital code, commonly referred to as the reference code, is used to represent the matched internal resistance. A set of these reference codes is easily used either directly or indirectly to compensate the circuits noted above. The matching technique consists of providing a feedback loop for matching the external resistor to the internal resistance. The reference code is continually updated. External noise may result in an updated reference code which differs from the old reference code by a large amount. Since the circuit characteristics that are being compensated vary slowly over time, there should not be large changes between reference code updates.

As illustrated in FIGS. 1 and 2, the compensation of critical circuits with respect to PVT is performed utilizing an external resistor to match the on-chip compensation circuit resistance. The internal resistance consists of a parallel combination of transistor legs, often referred to as dummy legs. These dummy legs may be identical to the actual transistor legs used in each circuit to be compensated.

The matching of the on-chip resistance to the external resistor is performed by turning on the transistor legs of the dummy device (shown as a dummy buffer 110 in FIGS. 1 and 2) until the effective on-chip resistance of the circuit is approximately equal to that of the external resistor 120. At that point, the analog comparator 150 trips and the number of transistor legs that have been turned on it is recorded in the up/down counter 180. The same number of transistor legs are then turned on in the actual circuit to be compensated.

FIG. 1, noted above, illustrates a simplified block diagram of a closed loop compensation circuit and FIG. 2 illustrates the details of the dummy buffer 110 of FIG. 1 and FSMs (Finite State Machines) 1–n, where n is the number of circuits to be compensated. The dummy buffer 110 and external resistor 120 form a voltage divider whose output is then compared in the analog comparator 150 with the output of a voltage divider formed by resistors R1 and R2 after both outputs have passed through respective low pass filters 130 and 140. The output of the analog comparator 150 is inputted to the latch 160 which receives a latching signal fsample. The output of the latch 160 is inputted to the up/down counter 180 after passing through another low pass filter 170. The up/down counter 180 also receives a signal labeled fupdate. While the counter 180 has for exemplary purposes been shown as being incremented, it can also be decremented. Since the circuit of FIG. 1 is a closed loop feedback system, care must be taken to insure a stable system and feedback stability issues governed by control theory add to the complexity of the compensation circuit. Typically, the update frequency fupdate must be lower than the 1/RC frequency of the low pass filters which in turn must be lower than the sampling frequency fsample. While this criteria may appear at first to be easy to meet, the low pass filters 130 and 140 of the analog comparator 150 are highly PVT dependent and it is therefore sometimes difficult to simulate their behavior.

Several variations of the above-noted arrangement have been used in both open-loop and closed-loop forms. Close-loop systems have the classical stability problems while the open-loop systems unfortunately have large variations in the reference code. Stability problems can be reduced at the cost of increased to design/debug cycles since a significant amount of time is required to insure closed loop stability. On the other hand, open-loop systems avoid stability issues at the cost of large variations in the reference code updates.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto . The spirit and scope of the present invention are limited only by the terms of the appended claims.

The following represents brief descriptions of the drawings, wherein.

DETAILED DESCRIPTION

Figure 1:
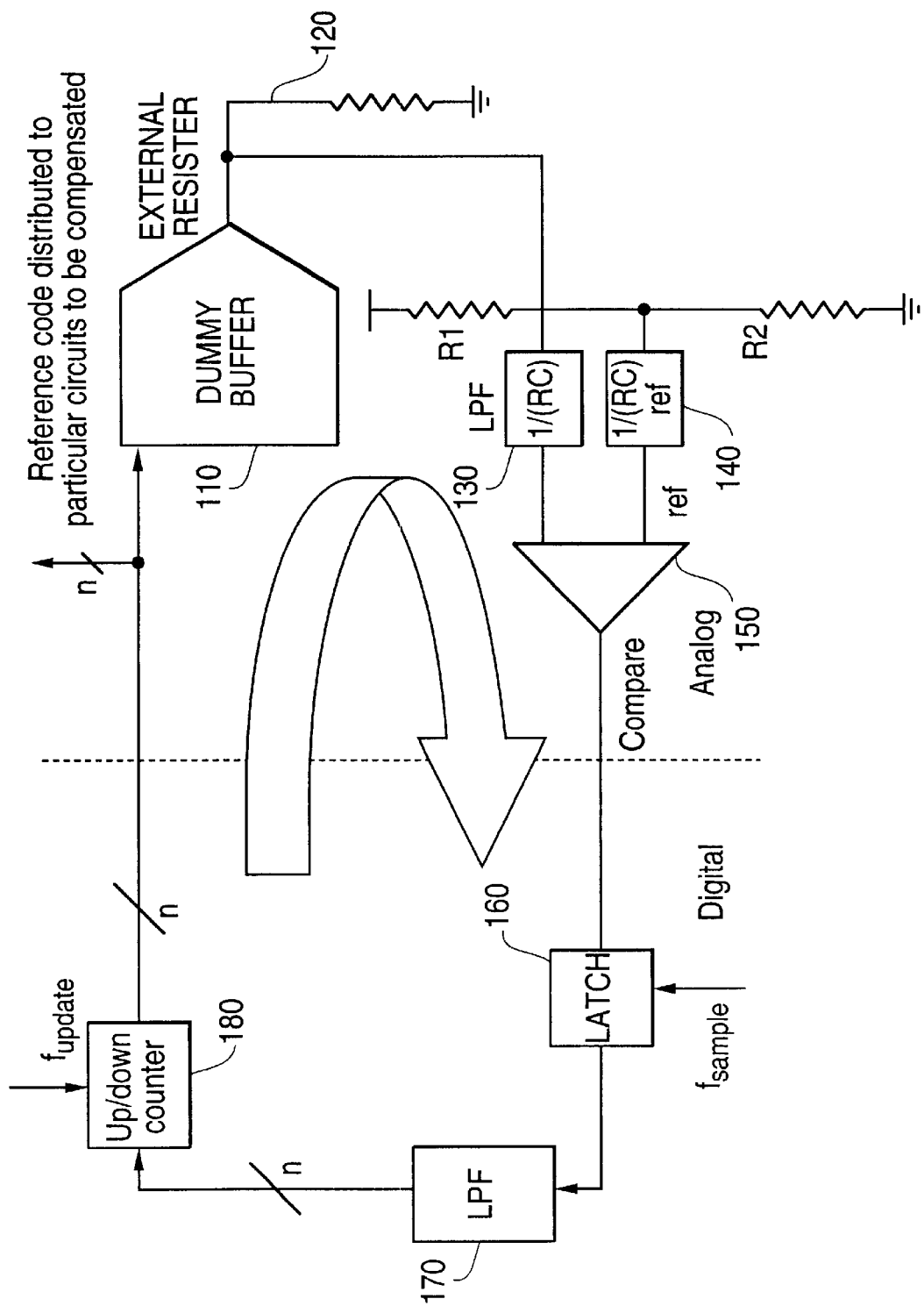
FIG. 1 is a simplified block diagram of a disadvantageous closed loop compensation circuit.
Figure 2:
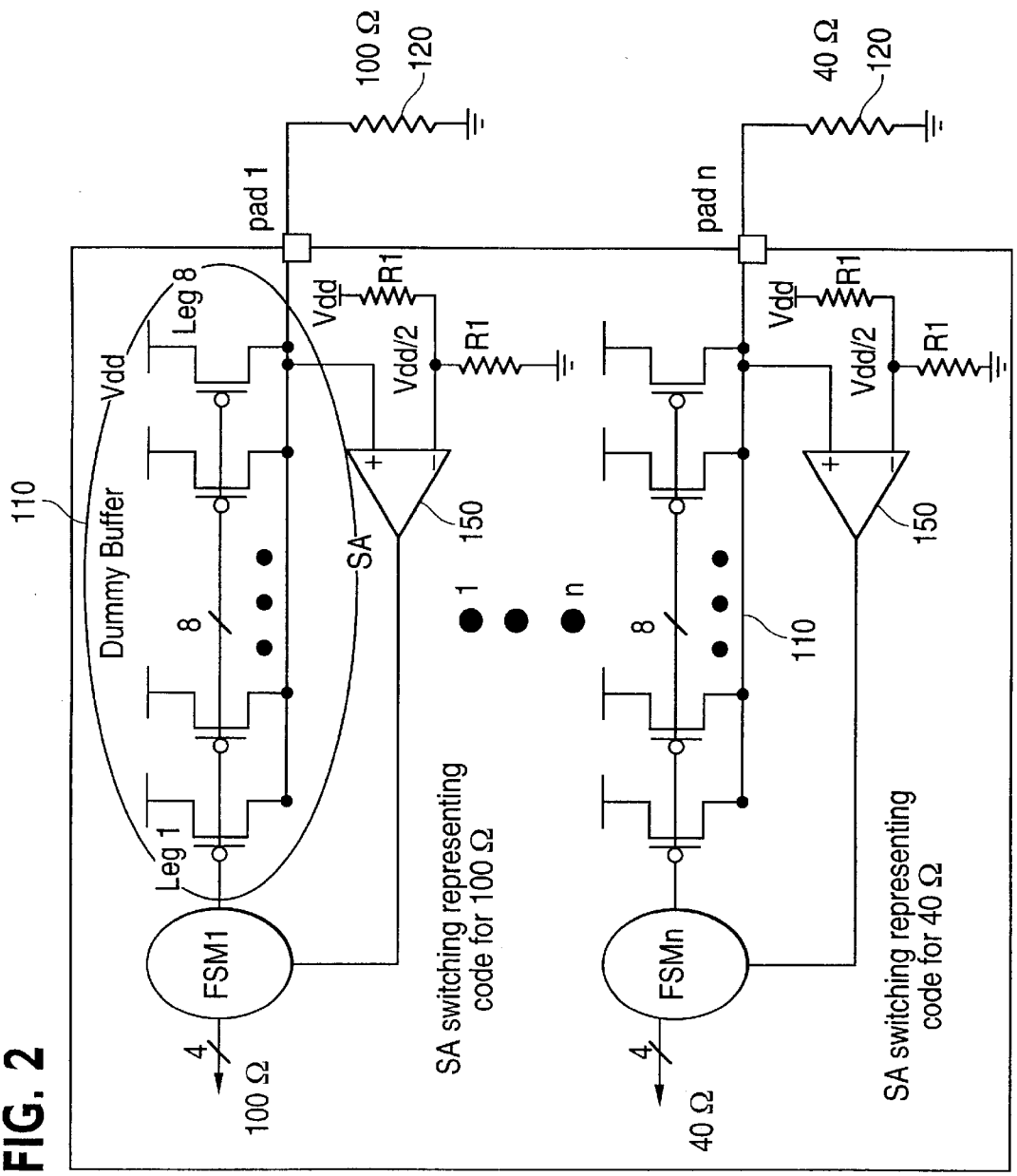
FIG. 2 illustrates the details of the dummy buffer 110 of FIG. 1.

Before beginning a detailed description of the subject invention, mention of the following is in order. When appropriate, like reference numerals and characters may be used to designate identical, corresponding, or similar components in differing drawing figures. Furthermore, in the detailed description to follow, example sizes/models/values/ranges may be given, although the present invention is not limited thereto. Still furthermore, the signals in the timing diagram are not drawn to scale and instead, exemplary and critical time values are mentioned when appropriate. Well-known power connections and elements have not been shown within the drawing figures for simplicity of illustration and discussion. Arrangements have been shown in block diagram form in order to avoid obscuring the invention and also view of the fact that specifics with respect to implementation of such block diagram arrangements are highly dependent upon the platform within which the present invention is to be implemented. Where specific details have been set forth in order to describe the example embodiments of the invention, it should be apparent to one skilled in the art that the invention can be practiced without, or with variations of these specific details. Finally, it should be apparent that differing combinations of hard-wired circuitry and software instructions can be used to implement embodiments of the present invention, that is, the present invention is not limited to any specific combination of hardware and software.

Figure 3:
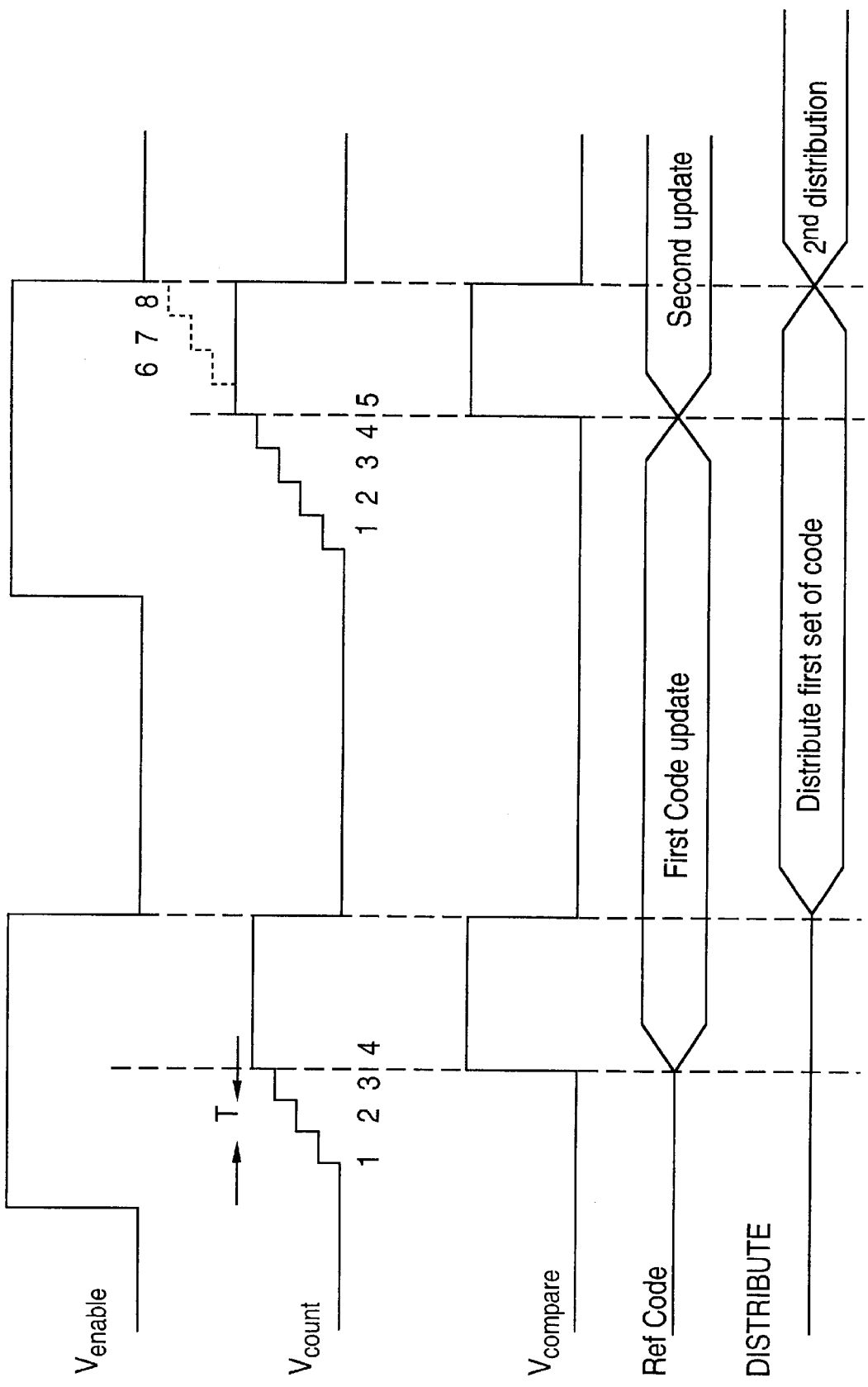
FIG. 3 is a timing diagram illustrating an example of an embodiment of the circuit compensation technique of the present invention.
Figure 4:
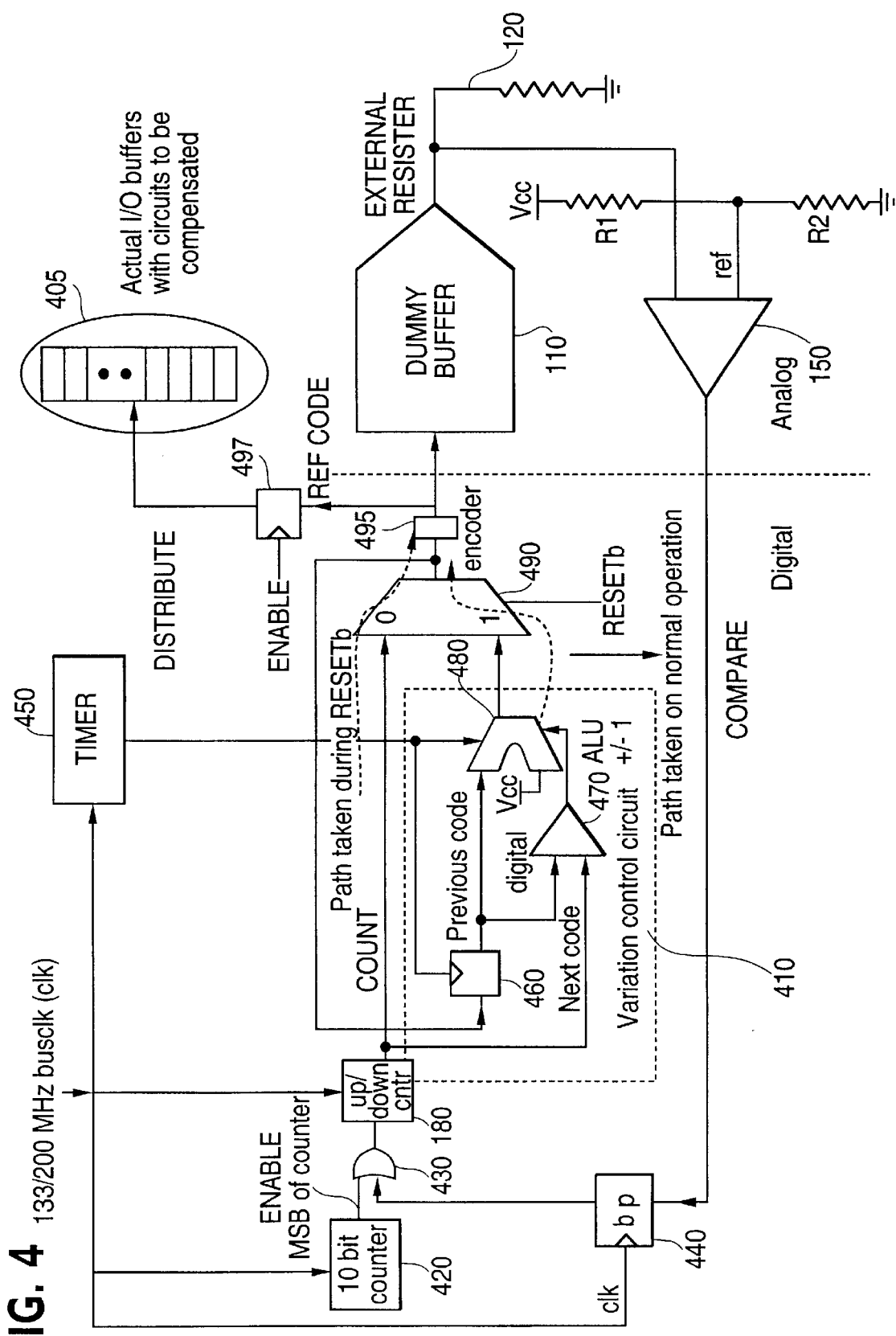
FIG. 4 is a simplified block diagram of an example of a circuit which operates in accordance with an embodiment of the compensation technique of the present invention.

FIG. 3 is a timing diagram illustrating an example of an embodiment of the circuit compensation technique of the present invention and FIG. 4 is a simplified block diagram of an example of a circuit which operates in accordance with an embodiment of the compensation technique of the present invention.

As shown in FIG. 4, the dummy buffer 110, external resistor 120, voltage divider R1–R2, and analog comparator 150 correspond to those illustrated in FIG. 1. Note that all of the other elements in FIG. 4 are digital elements rather than analog elements. A system clock, referred to as the 133/200 MHz buscik in this example, is used to clock a 10 bit counter 420, an up/down counter 180, a latch 440, and a timer 450. The output of the analog comparator 150 is inputted to the latch 440 whose output feeds a gate 430. The output of the gate 430 is used to enable the up/down counter 180 whose output is fed to a variation control circuit 410 and a multiplexer 490. The variation control circuit 410 consists of a latch 460, adder/subtractor 470, and ALU (Arithmetic Logic Unit) 480. The output of the multiplexer 490 is fed to an encoder 495 whose output feeds the dummy buffer 110 and a latch 497. It is to be noted that for the purpose of simplicity, various elements, such as the up/down counter 180 and the encoder 495, have been shown as having single input and output lines rather than more correctly showing multiple input and output lines. Furthermore, the clock frequency of the system clock is merely for illustrative purposes as is the number of bits of the counter 420.

The ENABLE signal, of FIGS. 3 and 4, is the MSB (Most Significant Bit) of the counter 420. During the high region of the ENABLE signal, a 4 bit COUNT signal is incremented once every T seconds, where T is in increments of time generated by the timer 450. Each increment turns on one device leg in the dummy buffer 110. For every increment, the on-chip reference resistance is compared to the external resistor 120. This procedure continues until the analog comparator 150 outputs a COMPARE signal indicative of the on-chip resistance of the dummy buffer 110 being equal to that of the external resistor 120. This results in the generation of a code referred to as the reference code which is latched in the latch 497 until the next updates cycle. The reference code is distributed upon the ENABLE signal changing state.

The next update of the reference code occurs at the next rising edge of the ENABLE signal and the COUNT signal once again begins to increment every T seconds until the on-chip resistance of the dummy buffer 110 is matched to the that of the external resistor 120. As an example, assume that the first update resulted in a reference code of 4 and the next update resulted in a reference code of 6 due to some noise received by the analog comparator 150. A difference of 2 in the reference code may result in large variations at the circuit to be compensated. To eliminate the effects of noise, the new reference code is only allowed to be updated from the previous reference code by +/−1. This is performed by the variation control circuit 410 by adding or subtracting one to the old reference code at the TIMER signal edge to generate a new reference code that is distributed at the falling edge of the ENABLE signal. If the old and new reference codes are the same, no updating is necessary. The eliminates the conventional "bang-bang" noise inherent in most dynamic compensation schemes.

The above noted limitation in the reference code updating by the variation control circuit 410 is not practical during start-up or power-up conditions of the processor since this would result in a considerable delay in reaching stable operating conditions. For this reason, the multiplexer 490 is provided such that upon at receiving a global RESETb signal, the variation control circuit 410 is bypassed and the output of the up/down counter 180 is directly fed to the encoder 495, thereby allowing larger updating values during start-up.

The timer 450 must be faster than the ENABLE signal to allow the up/down counter 180 to increment the COUNT signal to turn on all of the device legs before the ENABLE signal changes state. Furthermore, the ENABLE signal may be used as an oscilloscope trigger signal to simplify debugging since when the ENABLE signal changes state, the impact of code updates to buffer timings can be checked.

Unlike other disadvantageous closed loop compensation techniques, the compensation technique of the present invention is a stable compensation technique with a bypass (open-loop) mode for power-up/start-up conditions, thereby improving design cycle time. Furthermore, the compensation technique of the present invention enables most of the compensation circuit to be digital rather than analog, thereby simplifying the design and reducing costs. Still furthermore, the compensation technique of the present invention is a predictable compensation scheme, thereby allowing code and distribution updates at fixed intervals, that is, first a code update and then a distribution update, thus reducing debugging time. Lastly, by allowing the reference code to update by only +/−1 with respect to the previous reference code, undesirable large variations in the reference code are prevented. In effect, this serves as a low pass filter for reference code updates in that variations caused by supplying noise or other external noise sources on the reference code generation circuits will have minimal effect on the compensated circuit function because of the controlled code update methodology. In addition, the elimination of analog low pass filter circuits significantly reduces the PVT effects on the compensation circuit.

This concludes the description of the example embodiment. Although present invention has been described with reference to an illustrative embodiment thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings, and the appended claims without departing from the spirit of the invention. In addition to variations and modifications in the component parts and/or arrangements, alternative uses will also be apparent to those skilled in the art. For example, the counter can be decremented rather than incremented.

What is claimed is:

1. A method of compensating a characteristic of at least one circuit, the method comprising:

selectively one of incrementing or decrementing a characteristic of a dummy circuit and comparing it with a characteristic of an external reference to generate a reference code;

storing a previous reference code and comparing it with a present reference code; and selectively ensuring that the present reference code differs from the stored previous reference code by no more than a predetermined amount by ceasing the one of incrementing or decrementing of the characteristic of the dummy circuit and utilizing the present reference code to compensate the characteristic of the at least one circuit.

2. The method of claim 1, wherein selectively one of incrementing or decrementing a characteristic of a dummy circuit and comparing it with a characteristic of an external reference to generate a reference code comprises selectively one of incrementing or decrementing a resistance of a dummy circuit and comparing it with a resistance of an external reference to generate a reference code.

3. The method of claim 1, wherein selectively one of incrementing or decrementing a characteristic of a dummy circuit and comparing it with a characteristic of an external reference to generate a reference code comprises periodically one of incrementing or decrementing a characteristic of a dummy circuit from a first value to a second value and comparing it with a characteristic of an external reference to generate a reference code.

4. The method of claim 1, wherein selectively ensuring that the present reference code differs from the stored previous reference code by no more than a predetermined amount by ceasing the one of incrementing or decrementing the characteristic of the dummy circuit comprises selectively ensuring that the present reference code differs from the stored previous reference code by no more than one increment or decrement of the reference code by ceasing the one of incrementing or decrementing the characteristic of the dummy circuit.

5. The method of claim 1, further comprising inhibiting the ensuring that the present reference code differs by no more than a predetermined amount from the stored previous reference code upon start-up of the compensating method.

6. A compensation apparatus for compensating a characteristic of at least one circuit, the apparatus comprising:

a dummy circuit including a selectively adjustable characteristic to be controlled by a reference code to be inputted to said dummy circuit;

a comparator and an external reference device, said comparator to compare said selectively adjustable characteristic of said dummy circuit with a characteristic of said external reference device and to output a signal indicative of said selectively adjustable characteristic of said dummy device being equal to said characteristic of said external reference device;

a code generator to periodically generate one of an incremented or decremented reference code which is varied in increments, said code generator ceasing to increment or decrement said reference code upon receiving said signal from said comparator; and a variation control circuit to receive said one of an incremented or decremented reference code and to store a previous value of said reference code, said variation control circuit comparing said one of an incremented or decremented reference code upon said code generator ceasing to increment or decrement said reference code in response to said signal from said comparator with said stored previous value of said reference code and preventing said one of an incremented or decremented reference code from differing more than a predetermined number of increments from said stored previous value of said reference code, wherein said reference code is outputted to said at least one circuit to compensate said characteristic thereof.

7. The apparatus of claim 6, wherein said characteristic of said at least one circuit and said dummy circuit and said external reference device comprises a resistance.

8. The apparatus of claim 6, wherein said characteristic of said dummy circuit is periodically incremented or decremented from a first value to a second value.

9. The apparatus of claim 6, wherein the predetermined number of increments comprises one increment or decrement of said reference code.

10. The apparatus of claim 6, further comprising a bypass circuit to bypass a portion of said variation control circuit which prevents said one of an incremented or decremented reference code from differing more than a predetermined number of increments from said stored previous value of said reference code upon start-up of the compensating of said at least one circuit.

11. A compensation apparatus for compensating at least one circuit, the apparatus comprising:

a dummy circuit including a selectively adjustable resistance, said selectively adjustable resistance being controlled by a reference code to be inputted to said dummy circuit;

a comparator and an external reference resistance, said comparator to compare said selectively adjustable resistance of said dummy circuit with said external reference resistance and to determine when said selectively adjustable resistance is equal to said external reference resistance;

a code generator to periodically generate said reference code in one of increments or decrements from a first value to a second value, said code generator to cease to increment or decrement said reference code in response to said comparator; and a variation control circuit to receive said one of an incremented or decremented reference code and to store a previous value of said reference code, said variation control circuit to compare said incremented or decremented reference code upon said code generator ceasing to increment said reference code upon receiving said signal from said comparator with said stored previous value of said reference code and prevent said one of incremented or decremented reference code from differing more than a predetermined number of increments from said stored previous value of said reference code, wherein said reference code is to be outputted to said at least one circuit to compensate.

12. The apparatus of claim 11, wherein said predetermined number of increments or decrements comprises one increment of said reference code.

13. The apparatus of claim 11, further comprising a bypass circuit to bypass a portion of said variation control circuit to prevent said one of an incremented or decremented reference code from differing more than a predetermined number of increments from said stored previous value of said reference code upon start-up of the compensating of said at least one circuit.

14. The apparatus of claim 11, wherein said code generator comprises a first counter having an output coupled to one input of a gate whose output is coupled to a second counter, said gate having a second input coupled to an output of a latch whose input is connected to an output of said comparator.

15. The apparatus of claim 13, wherein said bypass circuit comprises a multiplexer to selectively output a code generator output during start-up or a variation control circuit output otherwise.

16. The apparatus of claim 11, wherein said variation control circuit comprises a latch to store said previous value of said reference code and a gate to compare a present code with the stored previous value of said reference code and an ALU (Arithmetic Logic Unit) to increment or decrement the reference code in accordance with an output of said gate.

17. The apparatus of claim 11, further comprising an encoder to encode an output of said variation control circuit and a latch to store an output of said encoder, an output of said latch to be inputted to said at least one circuit to compensate it.

* * * * *